(12) United States Patent
Matsuba et al.

(10) Patent No.: US 10,707,312 B2
(45) Date of Patent: Jul. 7, 2020

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hiroshi Matsuba, Fujisawa Kanagawa (JP); Hung Hung, Kawasaki Kanagawa (JP); Tatsuya Nishiwaki, Nonoichi Ishikawa (JP); Kikuo Aida, Nomi Ishikawa (JP); Kohei Oasa, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 13 days.

(21) Appl. No.: 16/119,983

(22) Filed: Aug. 31, 2018

(65) Prior Publication Data

US 2019/0296116 A1 Sep. 26, 2019

(30) Foreign Application Priority Data

Mar. 20, 2018 (JP) .................................. 2018-053358

(51) Int. Cl.
*H01L 29/78* (2006.01)
*H01L 29/40* (2006.01)
(52) U.S. Cl.
CPC .......... *H01L 29/407* (2013.01); *H01L 29/401* (2013.01); *H01L 29/404* (2013.01); *H01L 29/408* (2013.01)

(58) Field of Classification Search
CPC ... H01L 29/401; H01L 29/404; H01L 29/407; H01L 29/408; H01L 29/66727; H01L 29/7811
See application file for complete search history.

(56) References Cited

U.S. PATENT DOCUMENTS 4,532,534 A * 7/1985 Ford ................... H01L 29/0696
257/341
4,789,882 A * 12/1988 Lidow ................. H01L 29/0696
257/328

(Continued)

FOREIGN PATENT DOCUMENTS

JP 5580150 B2 8/2014

*Primary Examiner* — Eric A. Ward
(74) *Attorney, Agent, or Firm* — Kim & Stewart LLP

(57) ABSTRACT

According to one embodiment, there is provided a semiconductor device including a semiconductor substrate, a plurality of first columnar bodies having a peripheral edge, each of the columnar bodies spaced from one another on the semiconductor substrate, each including a first conductive layer extending from an upper end thereof in the depth direction of the semiconductor substrate, a base layer deposited about an outer peripheral surface of an upper end of the plurality of first columnar bodies, a gate adjacent to the base layer with a gate insulating film therebetween, a source layer connected to the base layer, and a second columnar body, including a second conductive layer, surrounding an outer peripheral edge of the plurality of first columnar bodies and extending in the depth direction of the semiconductor substrate.

11 Claims, 10 Drawing Sheets

(56) References Cited

U.S. PATENT DOCUMENTS

| | | |
|---|---|---|
| 8,227,810 B2 | 7/2012 | Okada et al. |
| 8,629,505 B2 | 1/2014 | Nishiwaki |
| 9,224,823 B2 | 12/2015 | Katoh et al. |
| 9,410,958 B2 | 8/2016 | Bertozzi et al. |
| 2012/0061753 A1 | 3/2012 | Nishiwaki |
| 2013/0168764 A1* | 7/2013 | Hsieh ................ H01L 29/41741 257/331 |
| 2016/0064477 A1* | 3/2016 | Blank ................... H01L 29/407 257/488 |
| 2016/0064547 A1* | 3/2016 | Siemieniec ......... H01L 29/7811 257/329 |
| 2016/0071940 A1 | 3/2016 | Okumura |
| 2016/0260829 A1 | 9/2016 | Aichinger et al. |
| 2019/0097004 A1* | 3/2019 | Ina ........................ H01L 29/407 |
| 2019/0165160 A1* | 5/2019 | Hutzler ............... H01L 29/0638 |

\* cited by examiner

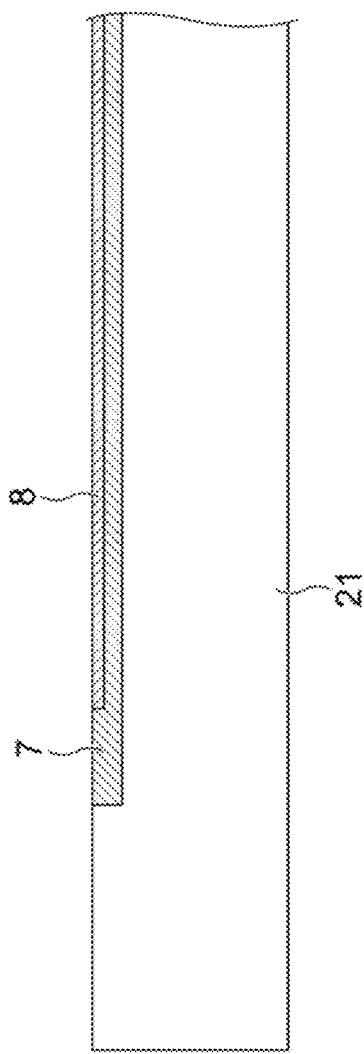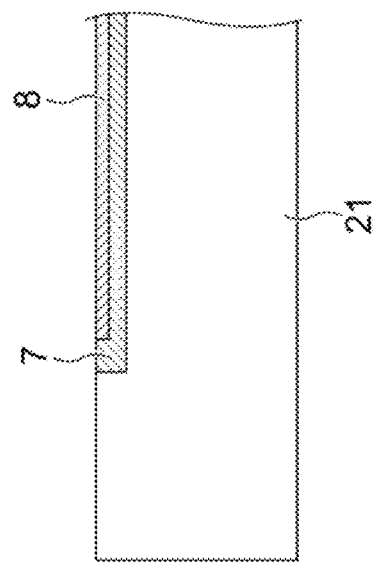

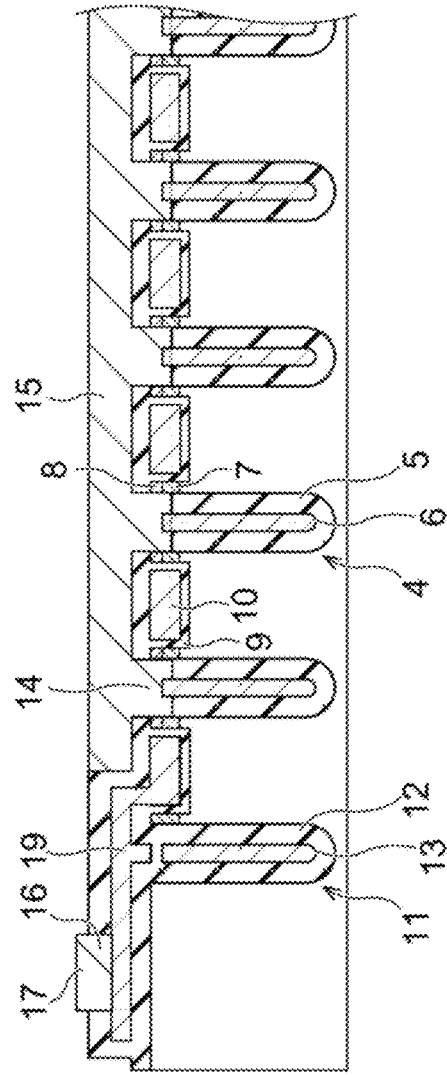
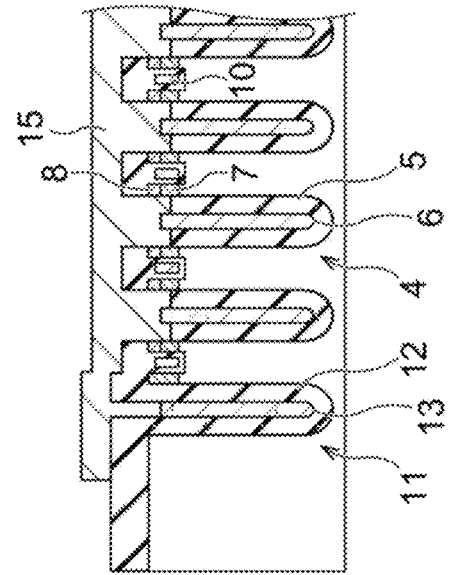
FIG. 6EA
FIG. 6EB

SEMICONDUCTOR DEVICE

CROSS-REFERENCE TO RELATED APPLICATION

This application is based upon and claims the benefit of priority from Japanese Patent Application No. 2018-053358, filed Mar. 20, 2018, the entire contents of which are incorporated herein by reference.

FIELD

Embodiments described herein relate generally to a semiconductor device.

BACKGROUND

As a structure for improving a cell breakdown voltage and on-resistance of a power MOSFET having a trench type field plate electrode structure, a structure in which a field plate electrode is embedded in a stripe shaped trench is known. In addition, in order to reduce the on-resistance, a power MOSFET having a column trench type field plate structure in which a field plate electrode is formed in a column shape to reduce an ineffective region where an on current does not flow, is known.

However, in the stripe trench type field plate structure, the distance between the field plate electrodes is constant, and in the column trench structure, the distance between the field plate electrodes tends to be non-uniform and there is a problem that the breakdown voltage of the device is lowered.

DESCRIPTION OF THE DRAWINGS

FIGS. 6AA and 6AB are diagrams illustrating a manufacturing process of the semiconductor device according to the embodiment.

FIGS. 6EA and 6EB are diagrams illustrating a manufacturing process following FIGS. 6DA and 6DB.

DETAILED DESCRIPTION

Figure 1:
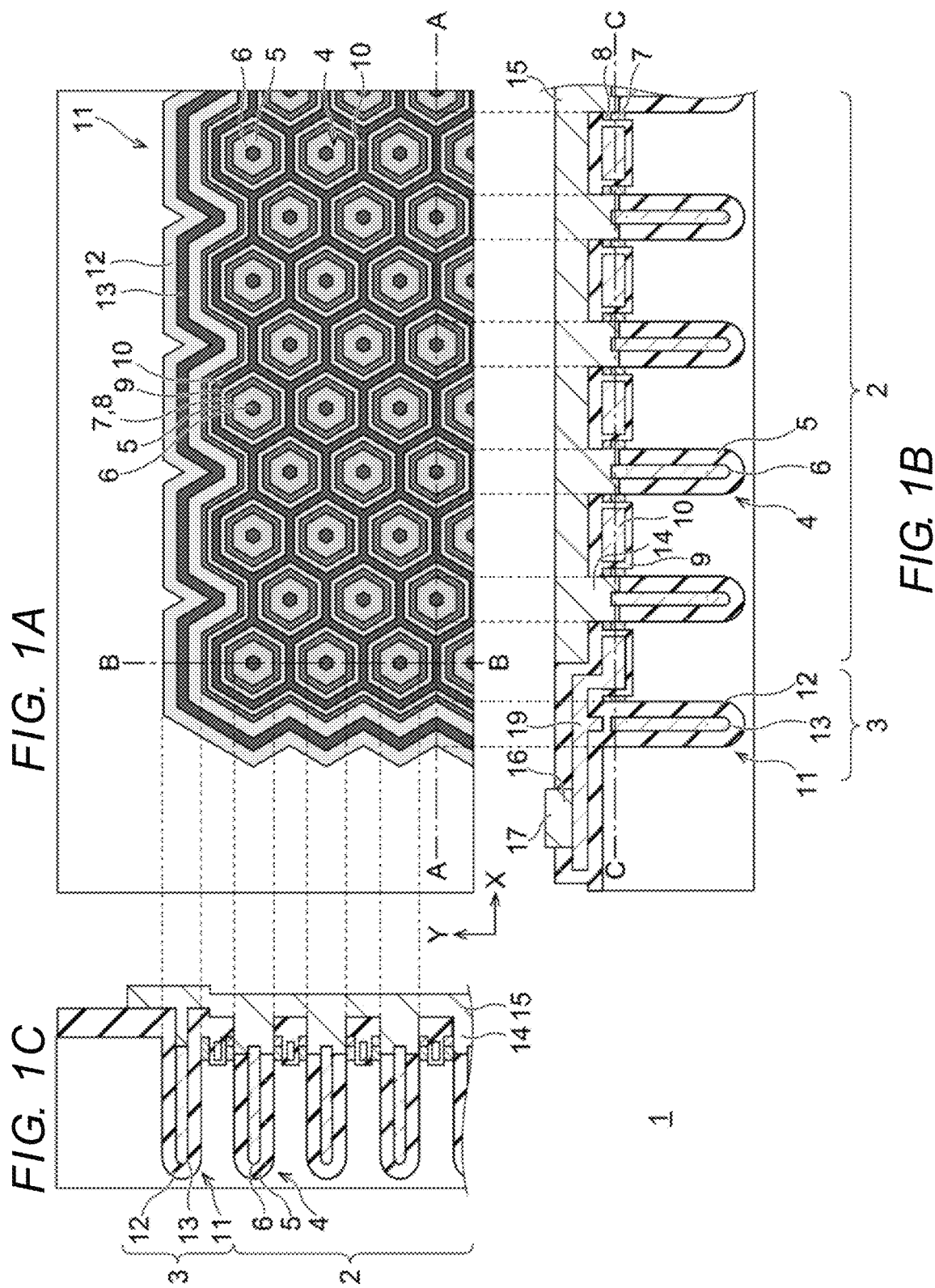
FIGS. 1A, 1B, and 1C are diagrams illustrating the main part of a semiconductor device according to the embodiment.

Embodiments provide a semiconductor device having improved breakdown voltage.

According to the embodiment, there is provided a semiconductor device including a semiconductor substrate, a plurality of first columnar bodies having a peripheral edge, each of the columnar bodies spaced from one another on the semiconductor substrate, each including a first conductive layer extending from an upper end thereof in the depth direction of the semiconductor substrate, a base layer positioned or deposited about an outer peripheral surface of an upper end of the plurality of first columnar bodies, a gate located adjacent to the base layer with a gate insulating film therebetween, a source layer connected to the base layer, and a second columnar body, including a second conductive layer, surrounding an outer peripheral edge of the plurality of first columnar bodies and extending in the depth direction of the semiconductor substrate.

Hereinafter, an embodiment of the present disclosure will be described with reference to the drawings. In the drawings attached to the present specification, for convenience of illustration and ease of understanding, the scales and the dimensional ratios of length and width are appropriately changed from those of actual devices and the sizes and ratios may be exaggerated.

Furthermore, as used in the present specification, it shall be interpreted that terms such as "parallel", "orthogonal", "same", and the like, values of length, angle, and the like, which specify shapes and geometric conditions and their degrees are not bound by a strict meaning and their scope of interpretation includes a range thereof where one can expect the same functionality of the described device.

FIGS. 1A, 1B, and 1C are diagrams illustrating a main part of a semiconductor device 1 according to an embodiment. FIG. 1A is a plan view of the semiconductor device 1 according to the embodiment. FIG. 1B is a sectional view taken along line A-A of FIG. 1A and FIG. 1C is a sectional view taken along line B-B of FIG. 1A.

The semiconductor device 1 of FIGS. 1A, 1B, and 1C is a power MOSFET. FIG. 1A illustrates a configuration from a cell region 2 to a termination region 3. As shown in FIGS. 1A, 1B, and 1C, a plurality of dot-shaped, in plan view, trenches (hereinafter, referred to as a field plate trench or an FP trench 4) are arranged in a zigzag manner from a plan view perspective of FIG. 1A. For example, the cross-sectional shape of each FP trench 4 is a regular hexagon and each FP trench 4 extends in a depth direction of the semiconductor device 1.

As shown in FIG. 1B, a field plate insulating film 5 and a field plate electrode 6 are formed in each FP trench 4. In the present specification, the field plate insulating film 5 and the field plate electrode 6 in the FP trench 4 are also referred to as a first columnar body. At the side of the upper end of each FP trench 4, a base layer 7 and a source layer 8 are arranged along an outer wall of each FP trench 4 in the depth direction, with the source layer 8 over the base layer 7. In addition, between the adjacent base layers 7 surrounding the trench opening end of the FP insulator 5, a gate electrode 10 is provided, with a gate insulating film 9 therebetween.

As shown in FIG. 1A, the base layer 7 and the source layer 8 extend in an approximately regular hexagonal shape about the outer peripheral surface of each FP trench 4. Similarly, the gate electrode 10 also extends in an approximately regular hexagonal shape about the outer peripheral surface of each FP trench 4, outwardly thereof from the base layer 7 and the source layer 8. In FIG. 1A, the FP trenches 4 are arranged such that the distance between the centers of the adjacent FP trenches 4 is constant. In this manner, in the case of the structure of FIG. 1A, since nonuniformity of electric field distribution hardly occurs because of this regular spacing, the breakdown voltage of the semiconductor device 1 can be improved.

A termination trench 11 is formed so as to surround the outer peripheral edges of a plurality of FP trenches 4 in a first direction X and a second direction Y in the plane of the semiconductor device 1. The termination trench 11 has approximately the same width and depth as the FP trenches 4. Inside of the termination trench 11, an insulating film 12 and a termination electrode 13 are formed. The termination electrode 13 is electrically connected to the source layer 8. The termination trench 11 is formed in a shape following the outer shape of the plurality of FP trenches 4 arranged at the outer periphery. In the present specification, the insulating film 12 and the termination electrode 13 in the termination trench 11 are referred to as a second columnar body.

Figure 2:
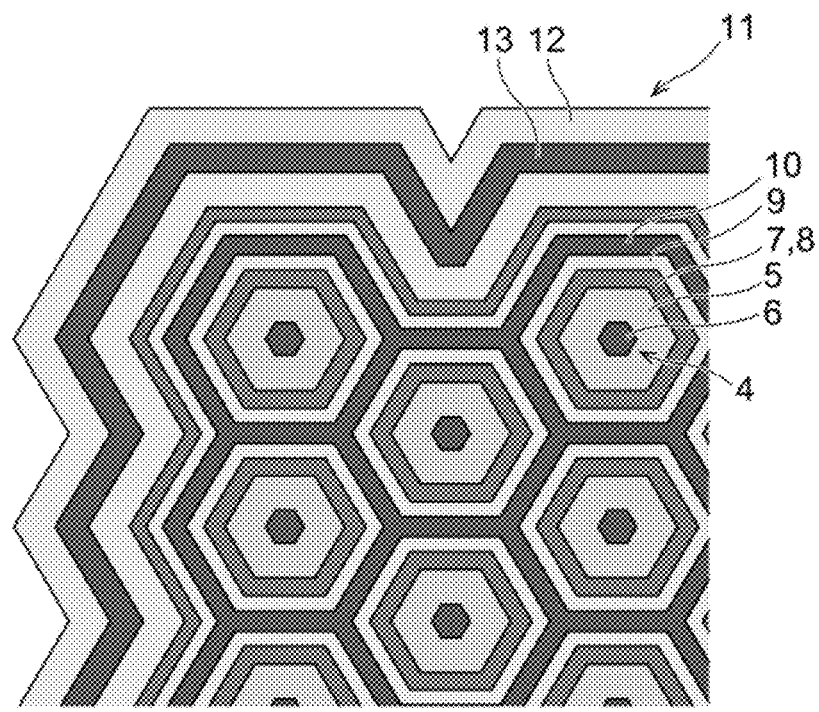
FIG. 2 is an enlarged plan view of the vicinity of a termination trench.

FIG. 2 is an enlarged plan view of the vicinity of the termination trench 11. In this manner, the termination trench 11 follows the outer shape of the FP trenches 4. With this layout, the shortest distance from the termination electrode 13 in the termination trench 11 to the FP trenches 4 nearest the termination trench 11 is approximately constant regardless of the location on the termination trench. With this, the breakdown voltage of the semiconductor device 1 can be improved.

Figure 3A:
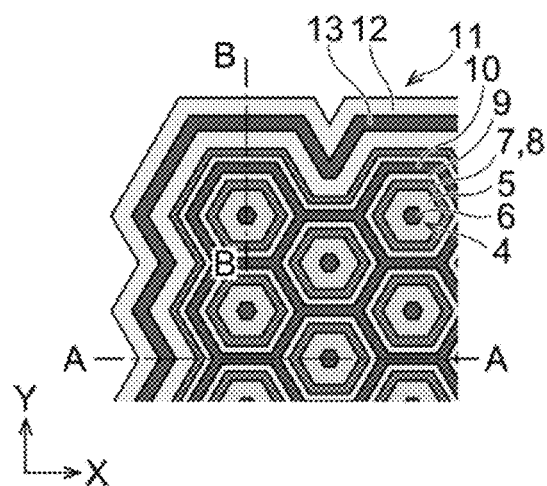
FIGS. 3A, 3B, and 3C are diagrams illustrating a configuration in the vicinity of a termination trench in detail.
Figure 3B:
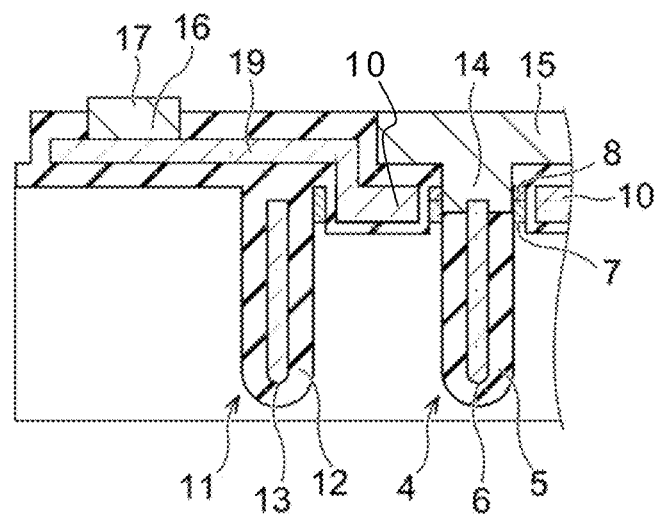
Figure 3C:
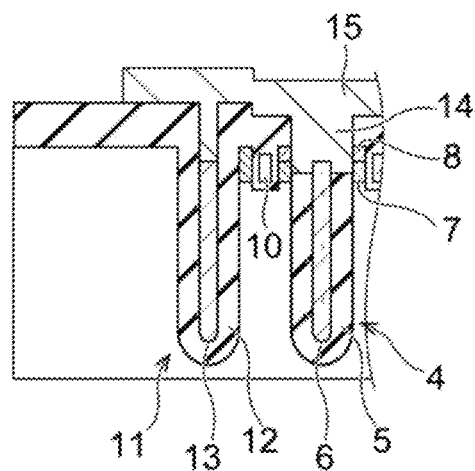

FIGS. 3A, 3B, and 3C are diagrams illustrating a configuration in the vicinity of the termination trench 11 in detail. FIG. 3A is a plan view at the left upper corner of FIG. 1A, FIG. 3B is a sectional view taken along line A-A of FIG. 3A, and FIG. 3C is a sectional view taken along line B-B of FIG. 3A.

As shown in FIG. 3B and FIG. 3C, an upper end portion of a field plate electrode 6 is connected to a source contact 14. The source contact 14 is connected to a source wiring layer 15 extending thereover. The source contact 14 is also connected to the source layer 8. The source wiring layer 15 extends in the first direction X above each FP trench 4.

In addition, as shown in FIG. 3C, an upper end portion of the field plate electrode 6 is also connected to the source wiring layer 15 extending in the second direction Y by the source contact 14. The source wiring layer 15 is connected to the termination electrode 13 in the termination trench 11 located at an end of the device in the second direction Y. By providing the termination trench 11, it is possible to improve the breakdown voltage of the device.

In addition, as shown in FIG. 3B, the gate electrode 10 is connected to a gate wiring layer 17 by a gate contact 16 located in the vicinity of the termination trench 11, and a gate lead-out layer 19 made of polysilicon connected to the gate wiring layer 17 crosses above the termination electrode 13 in the termination trench 11, and is connected to, for example, the gate wiring layer 17 at a terminal end side of the first direction X.

The gate wiring layer 17 is in a location where the source wiring layer 15 is not disposed. This prevents a problem such as a short circuit between the gate wiring layer 17 and the source wiring layer 15.

In FIG. 1A, an example in which a cross-sectional shape of the FP trench 4 is the regular hexagonal shape is illustrated. However, the cross-sectional shape of the FP trench 4 may be a shape other than the regular hexagonal shape. In addition, in FIG. 1A, the shape of the gate electrode 10 follows the outer shape of the FP trench 4, but the shape of the gate electrode 10 may be a stripe shape.

Figure 4A:
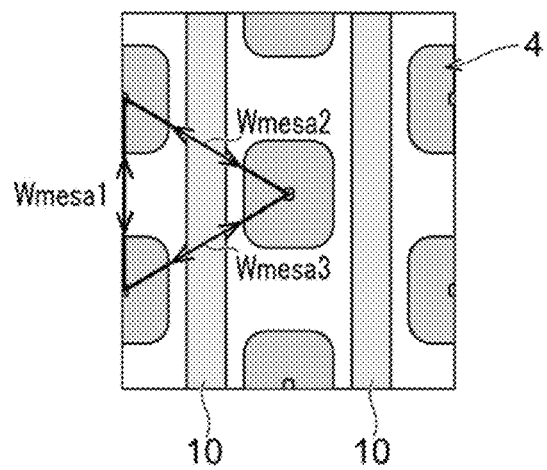
FIGS. 4A, 4B, and 4C are diagrams illustrating a cross-sectional shape of an FP trench.
Figure 4B:
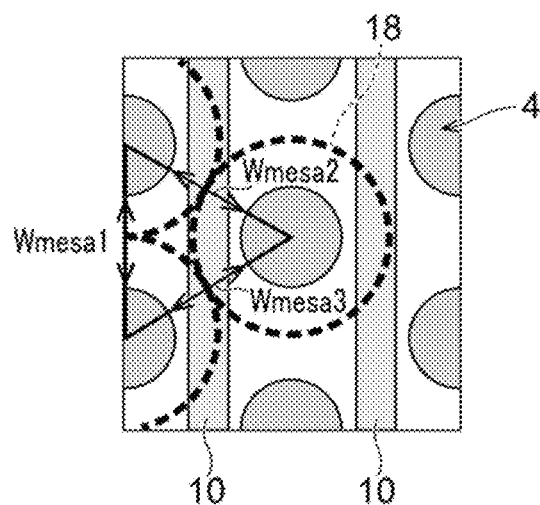
Figure 4C:
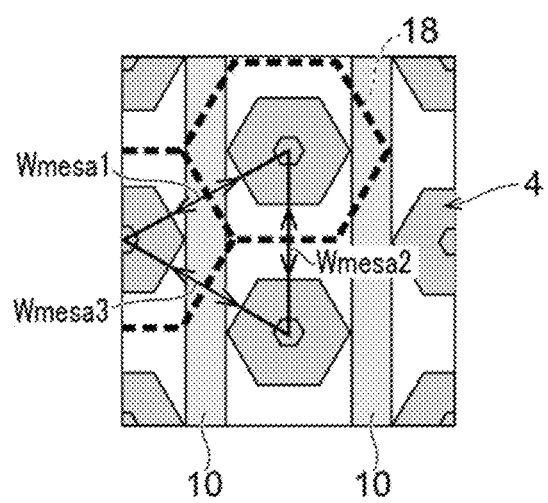

FIGS. 4A, 4B, and 4C are diagrams illustrating an example in which the cross-sectional shape of the FP trench 4 is a rectangular shape and the gate electrode 10 is formed in a stripe shape. In FIG. 4A, distances connecting the centers of any three adjacent FP trenches 4 are equal to each other. That is, an equilateral triangle is formed by line segments connecting the centers of these three FP trenches 4. In the case shown in FIG. 4A, since the distance between the adjacent field plate electrodes 6 is approximately the same, a difference of their breakdown voltages hardly occurs and the breakdown voltage of the semiconductor device 1 is improved.

FIG. 4B is a diagram illustrating an example in which the cross-sectional shape of the FP trench 4 is a circular shape and the shape of the gate electrode 10 is a stripe shape. Also, in a case of FIG. 4B, the distances connecting the centers of any three adjacent FP trenches 4 are equal to each other such that and equilateral triangle is formed by the line segments connecting the centers of these three FP trenches 4. With this, also, in a case of FIG. 4B, since the distance between the adjacent field plate electrodes 6 is approximately the same, the unevenness of the breakdown voltage hardly occurs and the breakdown voltage of the semiconductor device 1 can be improved.

FIG. 4C is a diagram illustrating an example in which the cross-sectional shape of the FP trench 4 is the regular hexagonal shape and the shape of the gate electrode 10 is the stripe, or straight line, shape. Also, in a case of FIG. 4C, the distances connecting the centers of any three adjacent FP trenches 4 are equal to each other such that an equilateral triangle is formed by the line segments connecting the centers of these three FP trenches 4. With this, also, in a case of FIG. 4C, since distances between the adjacent field plate electrodes 6 are approximately the same, the unevenness of the breakdown voltage hardly occurs and the breakdown voltage of the semiconductor device 1 can be improved.

In a case of FIG. 4C, since the spacing between adjacent FP trenches 4 is less than the spacing between those in FIG. 4A and FIG. 4B, the leading surfaces of depletion layers 18 spreading from an interface between each FP trench 4 and a drift layer are in contact with each other and the drift layer can be uniformly depleted. This means that the electric field distribution becomes uniform and the breakdown voltage of the semiconductor device 1 can be further improved.

For example, in a case of FIG. 4B, since the depletion layers 18 spreading from the interface between the FP trench 4 and the drift layer are in contact with each other only linearly along the direction of the stripe shaped field electrodes 10, the drift layer cannot be uniformly depleted, the electric field distribution becomes nonuniform, and the breakdown voltage is lowered. This phenomena also occurs in the case of the structure of FIG. 4A.

In the case of FIG. 1A according to the present embodiment, the termination trench 11 is shaped to follow along the outer shape of the FP trench 4 and the shortest distance between the termination electrode 13 and the adjacent field plate electrode 6 in the FP trenches 4 adjacent to the termination trench 11 is approximately the same. Therefore, it is possible to further process the breakdown voltage more uniformly than that which will occur in the structure of FIG. 4C, and to further improve the breakdown voltage of the device.

Figure 5A:
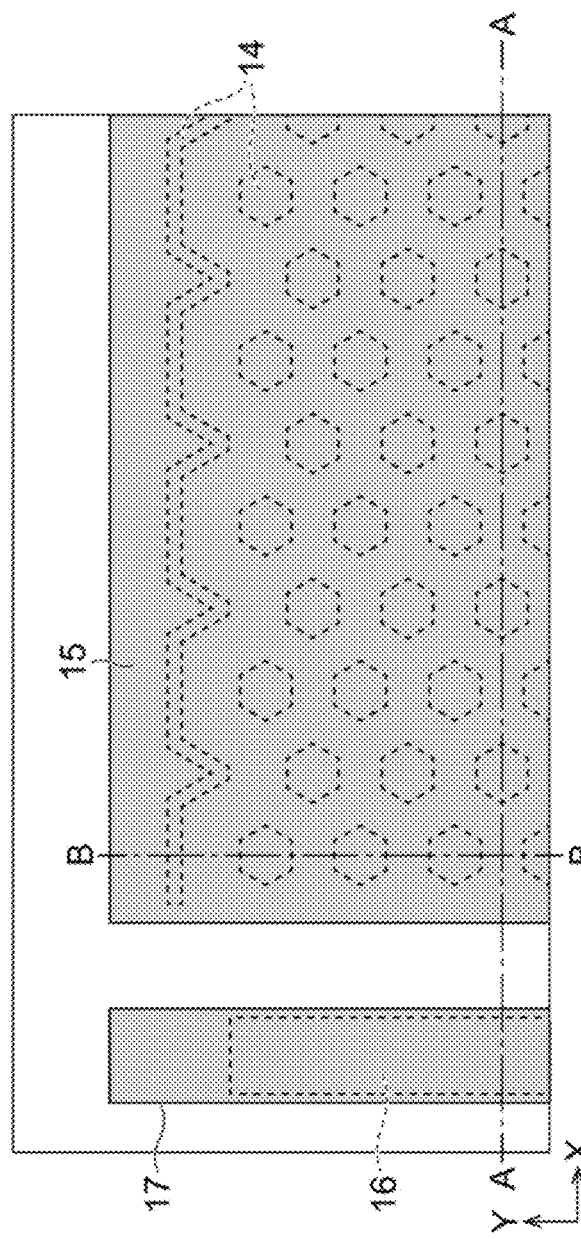
FIGS. 5A, 5B, and 5C are layout diagrams of contacts within the same range as that in FIG. 1.
Figure 5B:
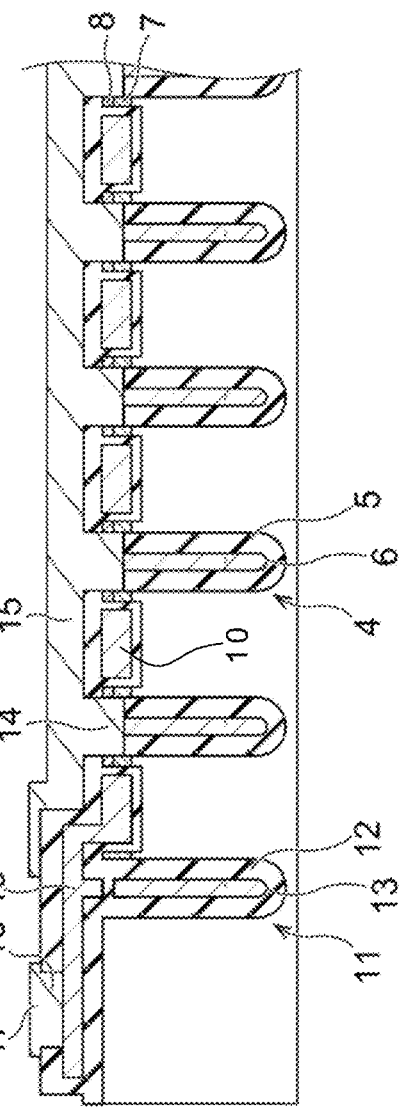
Figure 5C:
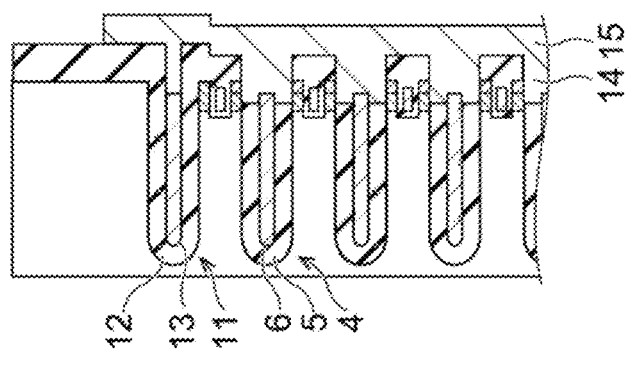

FIGS. 5A, 5B, and 5C are layout diagrams of contacts within the same region as that depicted in FIGS. 1A, 1B, and 1C. FIG. 5A is a plan view, FIG. 5B is a sectional view taken along line A-A of FIG. 5A and FIG. 5C is a sectional view taken along line B-B of FIG. 5A. FIG. 5A illustrates a plan view of the source wiring layer 15 and the gate wiring layer 17 as viewed from above, and illustrates the source contacts 14 located under the source wiring layer 15, and the gate contact 16 located under the gate wiring layer 17, in broken line outlines. FIG. 5B is the same section of the device as FIG. 1B and FIG. 5C is the same section of the device as FIG. 1C. As illustrated in FIGS. 5A and 5B, the source contact 14 extends inwardly of each FP trench 4. The source wiring layer 8 is electrically connected to the field plate electrode 6 by the source contact 14. In addition, as shown in FIG. 5C, the source contact 14 is also on the termination electrode 13 in the termination trench 11 and the termination electrode 13 is electrically connected to the source wire via the source contact 14. In addition, the gate wiring layer 17 is connected to the gate electrode 10 by the gate contact 16. The gate contact 16 is at a location where the source contact 14 is not present. More specifically, for example, the source contact 14 is located at opposed sides of a terminal end in a Y direction of a region of field plate electrodes 6 and connected to the source wiring layer 15 as shown in FIG. 5C, i.e., on either side of an array of FP trenches 5 in the Y direction, and the gate contact 16 is located at, for example, the opposed sides of the terminal end in the X direction of a region of field plate electrodes 6, i.e., on either side of an array of FP trenches 5 in the X direction, and are connected to the gate wiring layer 17 as shown in FIG. 5B. In this manner, the source contact 14 connected to the source wiring layer 15 is along a first side and a second side, opposed to each other, of an array of FP trenches 5 and the gate contact 16 connected to the gate wiring layer 17 is along a third side and a fourth side of an array of FP trenches 5 in a direction intersecting a direction of the first side and the second side.

FIG. 6AA to FIG. 6EB are diagrams illustrating a manufacturing process of the semiconductor device 1 according to the embodiment. Hereinafter, a manufacturing method of the semiconductor device 1 according to the embodiment with be described using these diagrams. In FIG. 6AA to FIG. 6EB, FIG. 6AA illustrates a sectional view taken along line A-A of FIG. 1A and FIG. 6AB illustrates a sectional view taken along line B-B. First, as shown in FIGS. 6AA and 6AB, implanting of p-type impurity ions such as boron into a part of the drift layer 21 made of an n-type silicon layer followed by a thermal diffusion step is performed such that the base layer 7 is formed. Next, implanting of a high concentration n-type impurity ions into a part of the base layer 7 followed by a thermal diffusion step is performed, such that the source layer 8 made of n+ silicon layer is formed over the base layer 7.

Figure 6B:
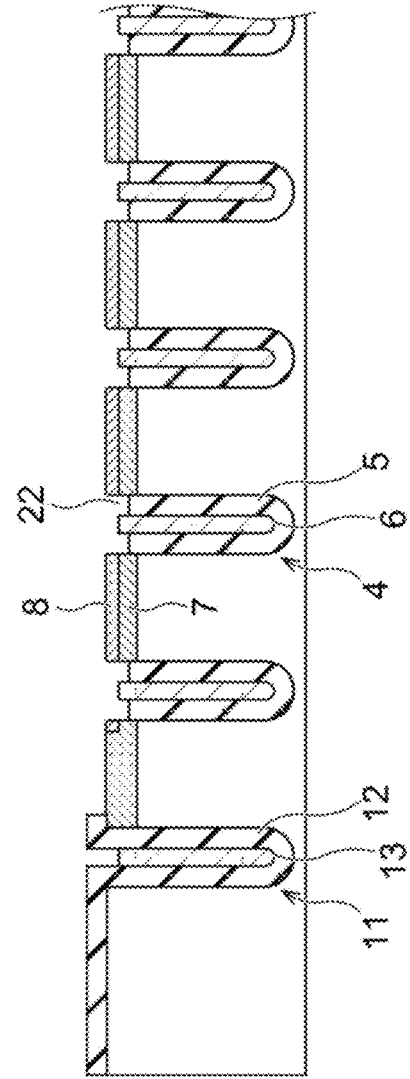
FIGS. 6BA and 6BB are diagrams illustrating a manufacturing process following FIGS. 6AA and 6AB.
Figure 6B:
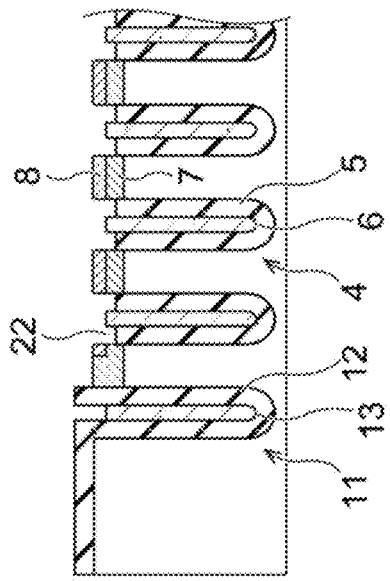

Next, as shown in FIGS. 6BA and 6BB, after forming an oxide film, it is covered with a resist layer which is patterned, and an etching of the oxide film is performed using the resist layer as a patterned mask. The resist is removed after performing patterning of the oxide layer and the underlying silicon layer is etched using the patterned oxide film as a mask such that the FP trenches 4 and the termination trench 11 are formed. Next, in the FP trenches 4 and the termination trench 11, after silicon oxide films 5 and 12 are formed by thermal oxidation or chemical vapor deposition (CVD), the field plate electrode 6 and the termination electrode 13 of polysilicon are formed by the CVD. Although the diameters of the FP trench 4 and the termination trench 11 are different based on their intended breakdown voltages, the diameters are, for example, approximately 1 µm to 2 µm. Next, in the vicinity of surfaces of the FP trench 4 and the termination trench 11, the silicon oxide films 5, 12 are etched back such that a recess 22 is formed inwardly of the source layer 8 and inwardly of the base layer 7.

Figure 6C:
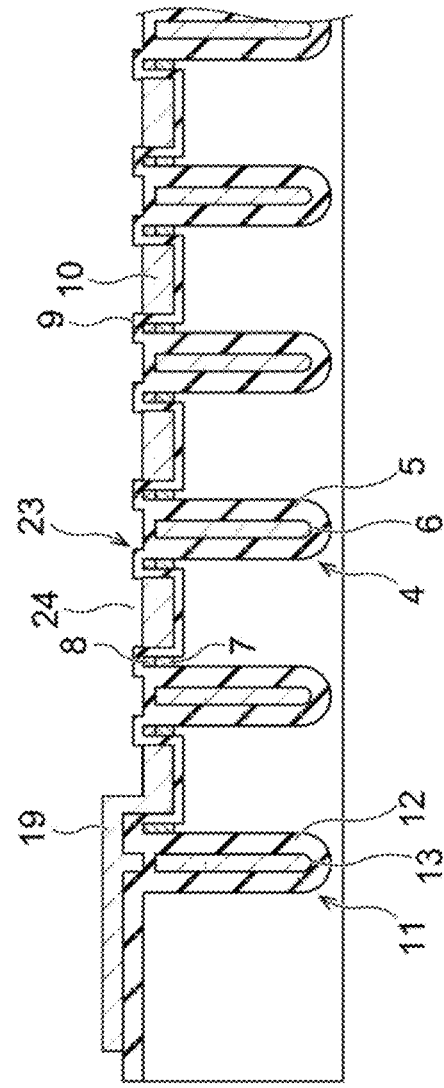
FIGS. 6CA and 6CB are diagrams illustrating a manufacturing process following FIGS. 6BA and 6BB.
Figure 6C:
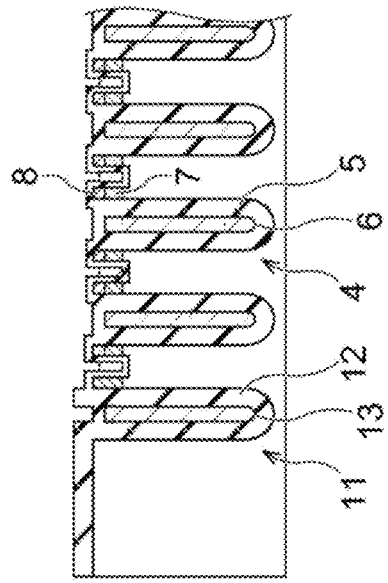

Next, as shown in FIGS. 6CA and 6CB, between the FP trenches 4, a gate trench 23 is formed by the forming a mask using lithography or the like and etching through the source layer 8 and base layer 7 and inwardly of the underlying silicon layer. Next, after a gate insulating film 9 made of silicon oxide is formed in the gate trench 23, the gate electrode 10 made of the polysilicon is formed thereover by CVD. Then, the silicon oxide film over the front surface of the gate trench 23 is etched back such that a recess 24 is formed.

Figure 6D:
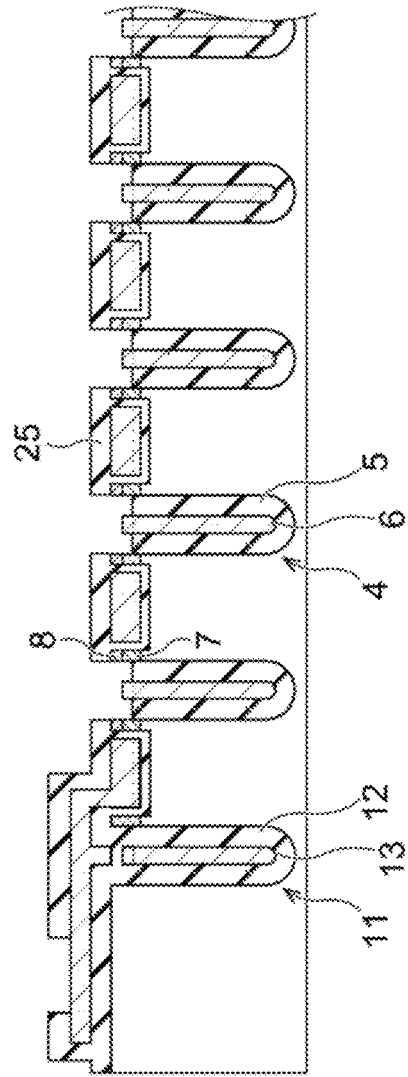
FIGS. 6DA and 6DB are diagrams illustrating a manufacturing process following FIGS. 6CA and 6CB.
Figure 6D:
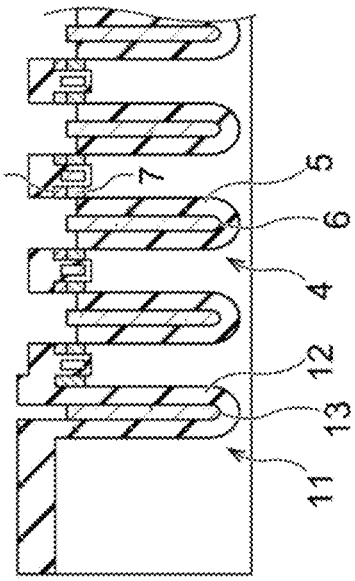

Next, as shown in FIGS. 6DA and 6DB, on an upper surface of the gate electrode 10, an interlayer insulating film 25 made of the silicon oxide film is formed. Next, an opening is formed on the interlayer insulating film 25 using a patterned resist as a mask such that an opening for the source contact 14 and an opening for the gate contact 16 are formed.

Next, as shown in FIGS. 6EA and 6EB, after forming a wiring layer by sputtering or the like, the wiring layer is processed with a patterned resist such that the source wiring layer 15 and the gate wiring layer 17 are formed spaced from one another.

Thus, in the embodiment, since the respective FP trenches 4 are arranged in a zigzag manner with constant pitches between three adjacent FP trenches 4, it is possible to equalize the distances between adjacent field plate electrodes 6, to provide a uniform breakdown voltage thereof, and to improve the breakdown voltage of the device.

In addition, in the embodiment, since the termination trenches 11 are arranged so as to surround the plurality of FP trenches 4 two-dimensionally arranged in the plane and the shape of the termination trenches 11 is formed along the outer peripheral edge of the plurality of FP trenches 4, it is possible to uniformly form the distance between the termination electrode 13 in the termination trench 11 and the FP trench 4 in a cell portion and to also improve the breakdown voltage of the device.

Furthermore, by forming the cross-sectional shape of the FP trench 4 as a regular hexagonal shape, the depletion layers 18 spreading in the vicinity of the FP trench 4 are in surface contact with each other and the drift layer can be uniformly depleted such that the electric field distribution becomes uniform and the breakdown voltage of the device can be improved.

In addition, by forming the termination trench 11 in accordance with an outer shape of the FP trench 4, it is possible to further provide a uniform distance between the termination trench 11 and the adjacent field plate electrodes 6 and the breakdown voltage of the device can be further improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor substrate;
   a plurality of first columnar bodies having a peripheral edge, each of the columnar bodies spaced from one another on the semiconductor substrate, each including a first conductive layer extending from an upper end thereof in the depth direction of the semiconductor substrate;
   a base layer deposited about an outer peripheral surface of an upper end of the plurality of first columnar bodies;
   a gate layer adjacent to the base layer with a gate insulating film therebetween;

a source layer connected to the base layer;

a second columnar body, including a second conductive layer, surrounding an outer peripheral edge of the plurality of first columnar bodies and extending in the depth direction of the semiconductor substrate;

a source wiring layer above the first conductive layer in each of the plurality of first columnar bodies and above at least a part of the second conductive layer, and electrically connected to the first conductive layer in each of the plurality of first columnar bodies and to the second conductive layer in the second columnar body; and a gate lead-out layer that extends from a first region surrounded by the second columnar body over the second columnar body to a second region outside the first region and is electrically connected to the gate layer, the gate lead-out layer being electrically separated from the first conductive layer in each of the first columnar bodies and the second conductive layer in the second columnar body.

2. The semiconductor device according to claim 1, wherein three adjacent first columnar bodies of the plurality of first columnar bodies are equally spaced from one another.

3. The semiconductor device of claim 1, wherein the source layer is electrically connected to the plurality of first conductive layers.

4. The semiconductor device according to claim 1, further comprising:

a first contact extending between and electrically connecting the source wiring layer and the first conductive layer in each of the plurality of first columnar bodies; and a second contact connected to the gate lead-out layer.

5. The semiconductor device according to claim 4, wherein the plurality of first columnar bodies are located in a device region of the semiconductor device, and the second contact is located in a terminal region of the semiconductor device.

6. The semiconductor device according to claim 5, wherein the second columnar body is in the terminal region of the semiconductor device.

7. The semiconductor device according to claim 1, wherein the second conductive layer follows the shape of the outer periphery of the plurality of first columnar bodies.

8. The semiconductor device according to claim 1, wherein the gate layer extends as a stripe between two adjacent first columnar bodies among the plurality of the first columnar bodies.

9. The semiconductor device according to claim 1, wherein the gate layer extends as a stripe between a plurality of adjacent first columnar bodies.

10. The semiconductor device according to claim 1, wherein the spacing between the gate layer and an adjacent first columnar body is constant.

11. The semiconductor device according to claim 1, wherein the shape of each of the plurality of the first columnar bodies is the same, and is at least one of a rectangular, a circular, or a regular hexagonal shape.

* * * * *